United States Patent
Smith

(10) Patent No.: US 9,917,560 B1
(45) Date of Patent: Mar. 13, 2018

(54) INCREMENTAL WATTAGE REDUCTION IN A VACUUM TUBE AMPLIFIER

(71) Applicant: MESA/Boogie Ltd., Petaluma, CA (US)

(72) Inventor: Randall Smith, Petaluma, CA (US)

(73) Assignee: MESA/Boogie Ltd., Petaluma, CA (US)

( * ) Notice: Subject to any disclaimer, the term of this patent is extended or adjusted under 35 U.S.C. 154(b) by 0 days.

(21) Appl. No.: 15/473,137

(22) Filed: Mar. 29, 2017

(51) Int. Cl.
*H03F 3/72* (2006.01)
*H03F 3/28* (2006.01)
*H03F 3/22* (2006.01)
*H03F 3/181* (2006.01)

(52) U.S. Cl.
CPC ............... *H03F 3/72* (2013.01); *H03F 3/181* (2013.01); *H03F 3/22* (2013.01); *H03F 3/28* (2013.01); *H03F 2200/09* (2013.01); *H03F 2203/7236* (2013.01)

(58) Field of Classification Search
CPC ........................................................ H03F 3/72
USPC ........................................................ 330/119
See application file for complete search history.

(56) References Cited

U.S. PATENT DOCUMENTS

| | | | | | |
|---|---|---|---|---|---|
| 2,712,975 | A | * | 7/1955 | Golseth | A61B 5/0428 346/107.2 |
| 3,978,421 | A | * | 8/1976 | Walker | G10H 1/043 330/124 R |
| 4,644,289 | A | * | 2/1987 | Kennedy | H03G 3/22 330/118 |
| 4,713,624 | A | * | 12/1987 | Smith | H03F 3/28 327/560 |
| 2004/0140850 | A1 | * | 7/2004 | Tekushan | H03F 3/181 330/119 |
| 2006/0050900 | A1 | * | 3/2006 | Smith | G10H 1/0091 381/118 |

* cited by examiner

*Primary Examiner* — Patricia T Nguyen
(74) *Attorney, Agent, or Firm* — Schwegman Lundberg & Woessner, P.A.

(57) ABSTRACT

Disclosed is an amplifier for incremental wattage reduction. The amplifier comprises a first pair of pentode vacuum tubes and a second pair of pentode vacuum tubes arranged in a push-pull-parallel power configuration. Each pentode vacuum tube from the first pair of pentode vacuum tubes and the second pair of pentode vacuum tubes includes a plate element, a screen grid element and a cathode element. The amplifier further comprises a single multi-position user switch to configure the first pair of pentode vacuum tubes and the second pair of pentode vacuum tubes to achieve varying wattage outputs of the amplifier by deactivating at least one of the first pair of pentode vacuum tubes or the second pair of vacuum tubes, and causing at least one of the first pair of pentode vacuum tubes or the second pair of vacuum tubes to operate as triodes.

14 Claims, 1 Drawing Sheet

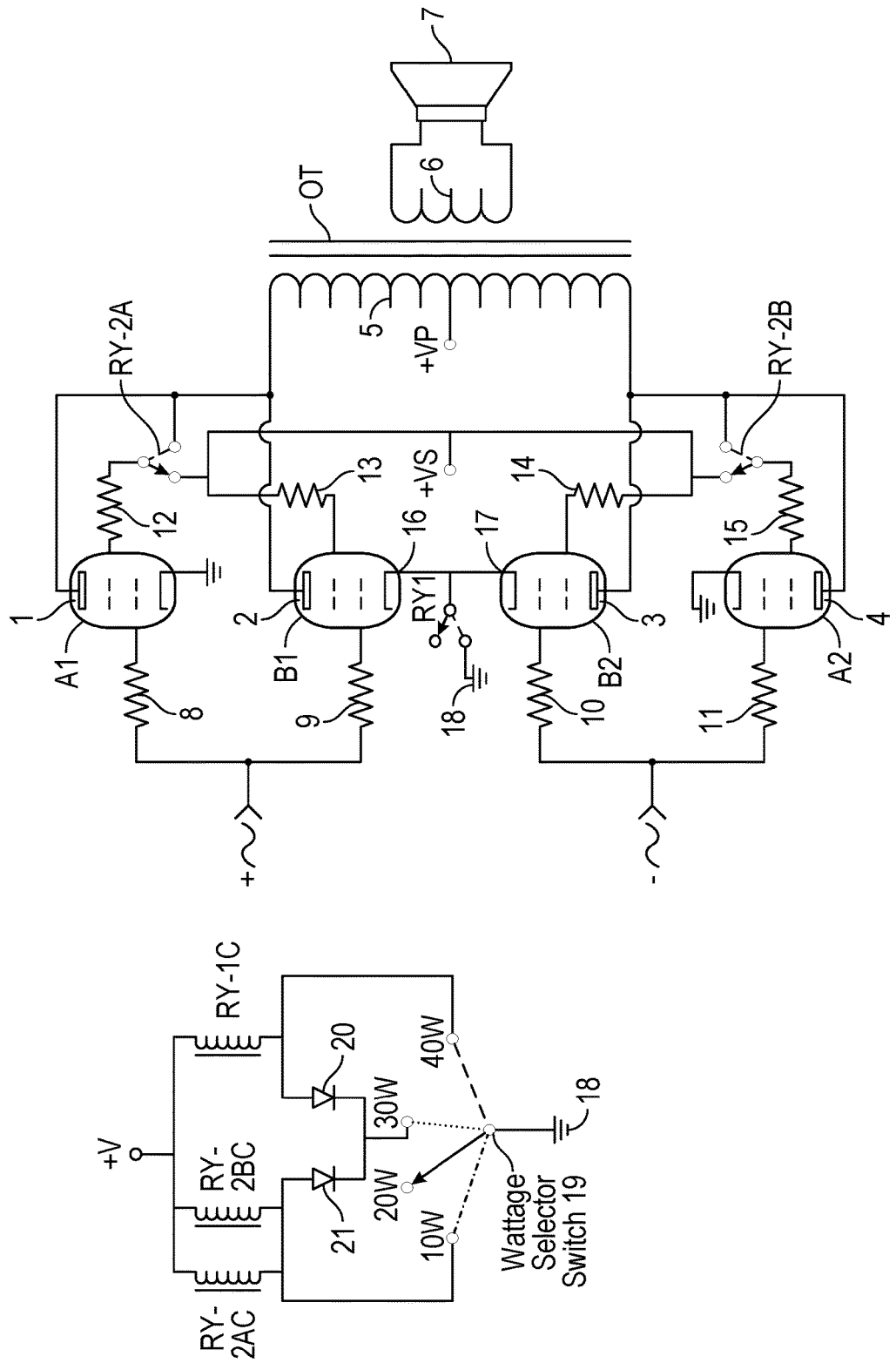

INCREMENTAL WATTAGE REDUCTION IN A VACUUM TUBE AMPLIFIER

TECHNICAL FIELD

The present disclosure generally relates to the technical field of vacuum tube amplifiers. In particular, the present disclosure related to an amplifier system for incremental wattage reduction in a vacuum tube amplifier.

BACKGROUND

Vacuum tube amplifiers for guitar are unsurpassed for their musicality. Historically, vacuum tube amplification was the only technology available at the dawn of the electric guitar and, as such, established tonalities that have become iconic and remain unsurpassed. Moreover, these musical sounds are still greatly sought after these many decades later. Newer technologies have sought to rival or replace vacuum tubes, usually in pursuit of economy, but have not yet succeeded. Transistorized amplifiers, for example, remain intrinsically limited because their technology, when overdriven, produces dissonant, abrasive sounding harmonics, which is not at all the desired musical distortion of overdriven vacuum tubes.

More recently, modeling technology has made inroads in the amplification market as it uses computer algorithms to basically "replay" sampled (i.e., pre-recorded) tonalities that are then triggered by the guitar. The pallet of available modeled tones invariably emphasizes a selection of well-known vacuum tube amplifiers, including many that are overdriven, again attesting to their lasting desirability. However, despite the convenience modeling offers, it lacks the expressively dynamic feeling produced by an authentic vacuum tube amplifier and leaves most players less than satisfied, and even less inspired due to its sterility. At best, the sound is a "good facsimile" but short of "the real thing." That elastic "tactile feedback" sensation the guitarist feels in his hands due to the dynamic characteristics of a high-voltage vacuum tube amplifier, especially one driven into and beyond the threshold of saturation, is a major factor in inspiring the musician's playing.

The most hallowed of overdriven tube distortion originates in the power output section of the amplifier. Many of the earliest blues players simply turned up too loud and found that the distortion harmonics generated by clipping the output tubes added greatly to the tonality and expressiveness of their guitar. These are the overdriven electric guitar sounds that became iconic foundations of tone. Blues music led to rock and roll and on to the stylistic extremes found today such as "heavy metal" which rely entirely on massive amounts of added harmonic distortion.

However, power amp overdrive distortion presents an inherent problem: producing the desired distortion is inseparably connected to playing loudness and the wattage of any given amplifier. As a result, a player very often found that he had either too little, or too much wattage at his disposal to "get his tone" in different venues at the appropriate loudness level.

While earlier solutions to this problem of separating overdrive distortion from playing loudness have been introduced, the Gold Standard of tone and legitimacy remains— not preamp, but overdriven vacuum tube power amp distortion.

In an effort to remedy the problem of overdrive distortion being dependent on loudness, the present inventor has previously introduced methods to halve the wattage of a power amplifier. One such method is to include in a push-pull amplifier, switching between pentode and triode configurations, triode operation having approximately half the wattage of pentode. A further method utilizing a four-tube push-pull parallel amplifier is to selectively disable one pair of output tubes. Although these methods are helpful, their shortcoming is that they can only halve the power and in a great many applications, this limitation falls well short of fulfilling the need for a greater degree of power reduction to suit different venues and musical styles.

BRIEF DESCRIPTION OF THE DRAWINGS

Various ones of the appended drawings merely illustrate example embodiments of the present disclosure and are not intended to limit its scope to the illustrated embodiments. On the contrary, these examples are intended to cover alternatives, modifications, and equivalents as may be included within the scope of the disclosure.

FIG. 1 is a circuit diagram for incremental wattage reduction in a vacuum tube amplifier, according to some example embodiments.

DETAILED DESCRIPTION

Reference will now be made in detail to specific example embodiments for carrying out the inventive subject matter of the present disclosure. In the following description, specific details are set forth in order to provide a thorough understanding of the subject matter. It shall be appreciated that embodiments may be practiced without some or all of these specific details.

Disclosed is an amplifier system for incremental wattage reduction in a vacuum tube amplifier. The present disclosure describes an amplifier that enables the scalable and incremental selection of multiple levels of output wattage from maximum output wattage (i.e., 100%), three-quarter output wattage (i.e, 75%), half output wattage (i.e., 50%), one-quarter output wattage (i.e., 25%), etc. For example, an amplifier using four typical 6V6 power output tubes can include a four-position switch that the player may use to select output capabilities of 10 watts, 20 watts, 30 watts or 40 watts. Using the popular 6L6 or EL-34 power tubes, the amplifier provides selectable power levels to adjust wattage output of the amplifier. For example, between 25 watts, 50 watts, 75 watts and 100 watts. These numbers also represent the percentages of power reduction typically provided by the invention. By providing the ability to reduce the wattage of an amplifier from one hundred percent to one quarter of its maximum wattage output (i.e., from maximum wattage output to one-quarter wattage output), and to further provide at least two increments of power before reaching the one-quarter wattage output (e.g., three-quarter wattage output and half wattage output), the goal of separating loudness from power overdrive characteristics within a single amplifier is largely achieved.

An amplifier comprising at least four pentode vacuum tubes (i.e., two pairs of pentode vacuum tubes) arranged in a typical push-pull-parallel configuration is provided with a single user-selectable switch that reconfigures the circuitry to provide a plurality of different wattage levels before overdrive saturation occurs. A pentode vacuum tube includes a cathode, a plate (i.e., anode), a control grid and a screen grid element. In the highest power configuration, all four pentode vacuum tubes (i.e., both pairs of pentode vacuum tubes) are configured for push-pull-parallel operation and all four pentode vacuum tubes are configured to operate as pentodes where their screen grids are connected to a separate high-voltage terminal and bypassed to ground by a capacitor.

In the amplifier, an approximately 25% reduction from maximum wattage (i.e., three quarter wattage output) is provided by switching one pair of the four pentode vacuum tubes to operate as triodes, each with its screen grid connected to its respective plate element, while the other pair of the four pentode vacuum tubes remains in pentode configuration (e.g., with their screen grids connected to a separate high-voltage terminal and bypassed to ground through a capacitor).

To achieve an approximately half-power output, the one pair of the pentode vacuum tubes is deactivated while the other pair of pentode vacuum tubes is configured to operate as pentodes. Deactivating one pair of push-pull pentode vacuum tubes may be accomplished by isolating their cathode elements from their current source. Other deactivating methods could include eliminating the AC signal voltage from their control grid elements, or decoupling their plate elements from the output transformer primary, however cathode switching is preferred for simplicity and efficiency.)

Half-power output can also be achieved by configuring both pairs of pentode vacuum tubes (i.e., all four pentode vacuum tubes) to operate as triodes. Configuring both pairs of pentode vacuum tubes to operate as triodes provides a darker sound than deactivating the one pair of pentode vacuum tubes and configuring the other pair of pentode vacuum tubes to operate as pentodes. Accordingly, in some embodiments, an amplifier can be configured to provide half power using both configurations.

Last, to achieve approximately a 75% reduction from maximum wattage (i.e., one-quarter wattage output), the switch deactivates the one pair of pentode vacuum tubes and configures the other pair of pentode vacuum tubes to operate as triodes.

Thus, the amplifier satisfies a long-felt need by providing the musician with one amplifier capable of switching incrementally to produce the wattage required by the venue while also obtaining the degree of authentic power tube saturation preferred by the musician. Utilizing a single simply labelled switch (e.g. 10 Watts, 20 Watts, 30 Watts, 40 Watts), the guitarist instantly understands the purpose and benefits of the present invention and can make incremental wattage adjustments literally "on the fly" during the performance.

FIG. 1 is a circuit diagram for incremental wattage reduction in a vacuum tube amplifier, according to some example embodiments. As shown, a first pairs of pentode vacuum tubes A1, A2, and a second pair of pentode vacuum tubes B1, B2 comprise a push-pull parallel power amplifier whose vacuum tube plate elements 1, 2, 3, 4 are connected to the primary winding 5 of output transformer OT whose secondary winding 6 couples to loudspeaker 7 for audio output. Control grid stop resistors 8, 9, 10, 11 serve to prevent oscillation. Push-pull drive signals and their respective phase relationships are indicated by the + and − symbols adjacent to the sine wave portrayals. Typical screen grid stop resistors 12, 13, 14, 15 further serve to prevent oscillation.

As shown, the wattage selector switch 19 allows a user to adjust the wattage amongst 4 potential outputs: maximum wattage output (e.g., 40 w), three-quarter wattage output (e.g., 30 w), half wattage output (e.g., 20 w), and one-quarter wattage output (e.g., 10 w). When the wattage selector switch 19 is set to the maximum wattage output position (e.g., 40 w), as shown by the dashed line, relay coil Ry-1C is energized and causes relay Ry-1 to couple the cathode elements 16, 17 of the second pair of pentode vacuum tubes B1, B2 to ground 18 as shown by the dashed line. In this configuration all four power pentodes A1, A2 and B1, B2 are operating in a parallel push-pull pentode mode to deliver maximum wattage output. Also note that in the schematic diagram of FIG. 1, the arrows show relays Ry-1, Ry-2A and Ry-2B in their power-off positions. Relays are shown for clarity of illustration. Any alternate type of switch may be substituted.

Rotating the wattage selector switch 19 to the three-quarter wattage output position (e.g., 30 w) will additionally energize relay coils 2AC, 2AB and cause relays 2A, 2B to switch to the dashed line positions and couple screen resistors 12, 15 to plate elements 1, 4 respectively for triode operation of the first pair of pentode vacuum tubes A1 and A2. Logic diodes 20, 21 isolate the operation of relay Ry-1 from relays Ry-2A and Ry-2B by enabling selective energizing of their coils Ry-1C and Ry-2AC, Ry-2BC. Thus, for the three-quarter wattage output position, all four power tubes A1, A2, B1 and B2 are functional. The first pair of pentode vacuum tubes A1, A2 are connected to operate as triodes while the second pair of pentode vacuum tubes B1, B2 continue to operate as typical pentodes.

Rotating the wattage selector switch 19 to the half wattage output position (e.g., 20 w) de-energizes all relay coils Ry-1C, Ry-2AC, Ry-2BC and returns the relays Ry-1, Ry-2A, Ry-2B to their power-off positions as indicated by the arrows. Thus, by disconnecting cathodes 16, 17 from ground 18, relay Ry-1 deactivates the second pair of pentode vacuum tubes B1, B2 for half-power operation provided by a single pair of power tubes (i.e., the first pair of pentode vacuum tubes A1, A2) operating in pentode configuration as shown by the arrows of Ry-2A, Ry-2B respectively that connect screen resistors 12, 15 to the high-voltage power supply terminal +VS.

Rotating the wattage selector switch 19 to select the one-quarter wattage output position (e.g., 10 w) energizes relay coils Ry-2AC, Ry-2BC such that relays Ry-2A, Ry-2B connect screen resistors 12, 15 to the plates 1, 4 and to the primary winding 5 of the output transformer 5, 6. Operating as triodes, the single pair of power tubes (i.e., the first pair of pentode vacuum tubes A1, A2) will produce approximately 25% of the maximum rated amplifier power.

Although the illustrated embodiment of the present invention comprises two pairs of output tubes, the principles laid forth herein apply equally to amplifiers that may comprise three or more pairs of vacuum tube output devices. One skilled in the art can easily see that an expanded range of wattage settings could be achieved by using these same switching techniques with an amplifier comprising more than two pairs of vacuum tube power.

Language

Although the embodiments of the present invention have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim are still deemed to fall within the scope of that claim.

What is claimed is:

1. An amplifier comprising:
    a first pair of pentode vacuum tubes and a second pair of pentode vacuum tubes arranged in a push-pull-parallel power configuration, each pentode vacuum tube from the first pair of pentode vacuum tubes and the second pair of pentode vacuum tubes including a plate element, a screen grid element and a cathode element; and
    a single multi-position user switch to configure the first pair of pentode vacuum tubes and the second pair of pentode vacuum tubes to achieve varying wattage outputs of the amplifier by deactivating at least one of the first pair of pentode vacuum tubes or the second pair of vacuum tubes, and causing at least one of the first pair of pentode vacuum tubes or the second pair of vacuum tubes to operate as triodes.

2. The amplifier of claim 1, wherein the single multi-position user switch, when in a first position, configures the first pair of pentode vacuum tubes and the second pair of pentode vacuum tubes to operate as pentodes, thereby providing maximum wattage output of the amplifier.

3. The amplifier of claim 2, wherein the single multi-position user switch, when in a second position, configures the first pair of pentode vacuum tubes to operate as triodes and the second pair of pentode vacuum tubes to operate as pentodes, thereby providing three-quarter wattage output of the amplifier.

4. The amplifier of claim 3, wherein the single multi-position user switch, when in a third position, configures the first pair of pentode vacuum tubes to operate as pentodes and deactivates the second pair of pentode vacuum tubes, thereby providing half wattage output of the amplifier.

5. The amplifier of claim 4, wherein the single multi-position user switch, when in a fourth position, configures the first pair of pentode vacuum tubes to operate as triodes and deactivates the second pair of pentode vacuum tubes, thereby providing one-quarter wattage output of the amplifier.

6. The amplifier of claim 5, wherein the single multi-position user switch, when in a fifth position, configures the first pair of pentode vacuum tubes and the second pair of pentode vacuum tubes to operate as triodes, thereby providing half wattage output of the amplifier.

7. The amplifier of claim 1, wherein the single multi-position user switch has three positions.

8. The amplifier of claim 1, wherein the single multi-position user switch has four positions.

9. The amplifier of claim 1, wherein the single multi-position user switch has five positions.

10. The amplifier of claim 1, further comprising:
    a third pair of pentode vacuum tubes arranged in a push-pull-parallel power configuration, each pentode vacuum tube from the third pair of pentode vacuum tubes including a plate element, a screen grid element and a cathode element, wherein the single multi-position user switch also configures the third pair of pentode vacuum tubes to achieve varying wattage outputs of the amplifier.

11. The amplifier of claim 10, wherein the single multi-position user switch configures the third pair of pentode vacuum tubes by deactivating the third pair of pentode vacuum tubes.

12. The amplifier of claim 10, wherein the single multi-position user switch configures the third pair of pentode vacuum tubes by causing the third pair of pentode vacuum tubes to operate as triodes.

13. The amplifier of claim 1, further comprising a plurality of preamplifier control channels.

14. The amplifier of claim 13, wherein each preamplifier control channel from the plurality of preamplifier control channels includes a separate dedicated wattage selector switch.

* * * * *